United States Patent [19]
Itoh et al.

[11] Patent Number: 5,912,505
[45] Date of Patent: Jun. 15, 1999

[54] SEMICONDUCTOR PACKAGE AND SEMICONDUCTOR DEVICE

[75] Inventors: Takuji Itoh; Toshihiko Kubo, both of Osaka, Japan

[73] Assignee: Sumitomo Metal (SMI) Electronics Devices, Inc., Yamaguchi, Japan

[21] Appl. No.: 08/743,160

[22] Filed: Nov. 4, 1996

[30] Foreign Application Priority Data

Nov. 7, 1995 [JP] Japan ................................. 7-288507

[51] Int. Cl.$^6$ ................................................. H01L 23/48
[52] U.S. Cl. .......................... 257/737; 257/738; 257/778; 257/779
[58] Field of Search ................................ 257/778, 779, 257/780, 737, 738

[56] References Cited

U.S. PATENT DOCUMENTS

| | | | |
|---|---|---|---|
| 5,147,084 | 9/1992 | Behun et al. | 228/56.3 |
| 5,591,941 | 1/1997 | Acocella et al. | 257/737 |

FOREIGN PATENT DOCUMENTS 63-104397  5/1988  Japan.

*Primary Examiner*—Peter Toby Brown
*Assistant Examiner*—Roy Potter
*Attorney, Agent, or Firm*—Burns, Doane, Swecker & Mathis, L.L.P.

[57] ABSTRACT

A semiconductor package and a semiconductor device comprises a metal bump to be placed between a metal pad formed on a package body of a substantially plate-like shape and an interconnecting solder for connecting a metal ball thereto, wherein the melting point of the metal bump is higher than that of the interconnecting solder, thereby enhancing a fatigue resistance against temperature fluctuations as well as improving a reliability around the interconnecting portion.

21 Claims, 5 Drawing Sheets

SEMICONDUCTOR PACKAGE AND SEMICONDUCTOR DEVICE

BACKGROUND OF THE INVENTION

1. Field of the Invention

The present invention relates to a semiconductor package on which a semiconductor chip is mounted and a semiconductor device such as LSI device in which the semiconductor package is mounted on a substrate, more particularly relates to the structure of interconnecting terminals therein.

2. Description of Related Art

Up to now PGA (Pin Grid Array) type package having pin electrodes has been the mainstream of the semiconductor package. It is however necessary that the PGA type package has a large pad diameter to assure its pin strength because using finer pins reduces the pin strength. This leads to low mounting density onto a printed circuit board resulting from larger pin-pitch, which causes such disadvantage as being hard to cope with dramatic increases of I/O terminal numbers concurrent with the development of LSI technology.

For this reason much more attention has recently been paid to packages of a BGA (Ball Grid Array) type. The assembly of the BGA type package is carried out as follows: First a metal pad is formed on a package. After this the metal pad is arranged so that it faces towards another metal pad on a surface of a printed circuit board. In alignment with their positions these two metal pads are melted and connected for forming an electrode through a metal ball in place of a pin of the PGA type. As for the BGA type package the metal ball is used in order to reduce the size of the metal pad, which makes it possible to accommodate greater numbers of interconnecting terminals compared with the PGA type package resulting in an increase of the mounting density with regard to the printed circuit board.

Ordinarily the terminals in the BGA type package are interconnected in such a method that the ball is attached to the metal pad by virtue of the adhesive force of a flux, and then fused during reflow soldering so as to connect the contact points of both metal pads and metal ball, as disclosed in Japanese Patent Application Laid-Open No.63-104397 (1988), for example. Another method is suggested in U.S. Pat. No. 5,147,084, wherein a high melting point solder ball is connected to the pad through adjacent low melting temperature solderable material. In the structures described above, however, the size of the interconnecting terminal is small in height, so that a crack may be permitted to grow therein. This phenomenon is due to thermal fatigue caused by the difference of the coefficient of thermal expansion between the package and the printed circuit board, which is triggered by heat generation within the LSI chip in mounting the package body of BGA type on the printed circuit board. The height of the interconnecting terminal has a profound influence on the degree of deformation therein. In other words a lower terminal leads to greater deformation and this is one of factors which reduce the reliability of the semiconductor device.

As is shown in FIG. 1 another semiconductor device is proposed in which an LSI chip is mounted on a substrate by a multi-layer solder bump scheme (monthly Semiconductor World Vol.6 No.12 pp.166–170 1987). According to this scheme a circuit board 11, a chip 15 are connected by interposing Cu-bump 14 and a two-sheet of polyimide films with Cu-bumps on each sheet 12. Additionally interposed is a Ti-film 13 not only between the Cu-bump 14 and the polyimide films with Cu-bumps 12 but also between the two sheets of polyimide films with Cu-bumps 12. The example shown here however has the following disadvantages: 1) preparation of the polyimide films fitted with bumps is costly; 2) a multiplicity of processes are required for connections.

SUMMARY OF THE INVENTION

The present invention has been devised to solve above-mentioned problems. Its main object is to provide a semiconductor package and a semiconductor device wherein a fatigue resistance against temperature fluctuations is enhanced and a reliability around the interconnecting portion is improved by providing a metal bump between a metal pad and an interconnecting solder.

In the present invention a metal bump having a higher melting point than that of an interconnecting solder is formed on a surface of a metal pad formed on a package body, wherein a metal ball is connected to the metal bump through the interconnecting solder.

An interconnecting terminal is made higher by providing the metal bump between the metal pad and the interconnecting solder. Consequently a deformation of the interconnecting terminal portion is decreased, so that the fatigue resistance is improved.

The above and further objects and features of the invention will more fully be apparent from the following detailed description with accompanying drawings.

DESCRIPTION OF THE PREFERRED EMBODIMENTS

The present invention will described with reference to accompanying drawings showing embodiments thereof as below.

Figure 1:
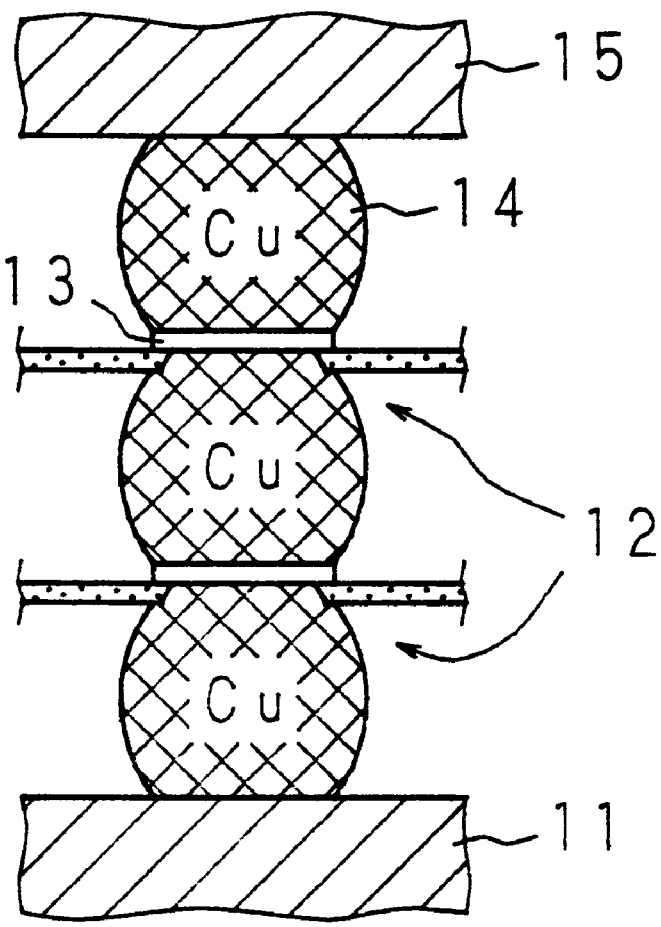
FIG. 1 is a schematic sectional view showing an interconnecting terminal in a conventional BGA type package.
Figure 2:
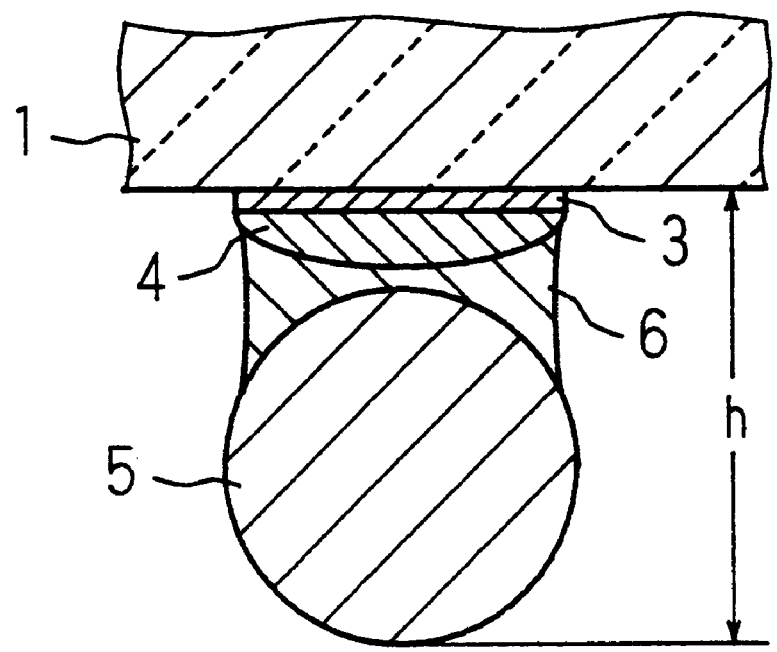
FIG. 2 is a schematic sectional view showing a main part of a semiconductor package of the present invention.

FIG. 2 is a schematic sectional view showing a main part of a semiconductor package according to the present invention. A metal bump 4 is formed under a metal pad 3 disposed on a surface of a package body 1. The metal bump 4 can take such shapes as semi-sphere, flatted-top conical, sunken-topped conical (as caldera volcano) and the like. A metal ball 5 is connected under the metal bump 4 with an interconnecting solder 6 by reflow soldering. In the process up to the connection of the metal ball, the package is placed in up-down opposite manner to one shown in FIG. 2 as described below. As some examples of the interconnecting terminal materials used in the present invention which includes the interconnecting solder 6, the metal bump 4 and the metal ball 5, five combinations of solder composition are given in Table 1.

TABLE 1

|  | Metal bump | Solder | Metal ball |
| --- | --- | --- | --- |
| Case 1 | 90Pb/10Sn (268/302° C.) | 63Sn/37Pb (183° C.) | 90Pb/10Sn (268/302° C.) |
| Case 2 | 90Pb/10Sn (268/302° C.) | 63Sn/37Pb (183° C.) | 95Pb/5Sn (300/314° C.) |
| Case 3 | 95Pb/5Sn (300/314° C.) | 63Sn/37Ph (183° C.) | 90Pb/10Sn (268/302° C.) |
| Case 4 | 95Pb/5Sn (300/314° C.) | 63Sn/37Pb (183° C.) | 95Pb/5Sn (300/314° C.) |
| Case 5 | 96.5Sn/3.5Ag (221° C.) | 63Sn/37Pb (183° C.) | 96.5Sn/3.5Ag (221° C.) |

(Note) Composition: weight %
( ): Melting point
$\left\{\begin{array}{l}\text{Left value . . . Solidus line}\\ \text{Right value . . . Liquidus line}\\ \text{Single value . . . Eutectic point}\end{array}\right\}$ The package of the BGA type is generally mounted onto the printed substrate with a solder of 63 Sn/37 Pb (wt. %). In the present invention melting of both the metal bump and the metal ball should be avoided during their mounting onto the printed substrate in order to maintain an interconnecting height as required.

Figure 3:
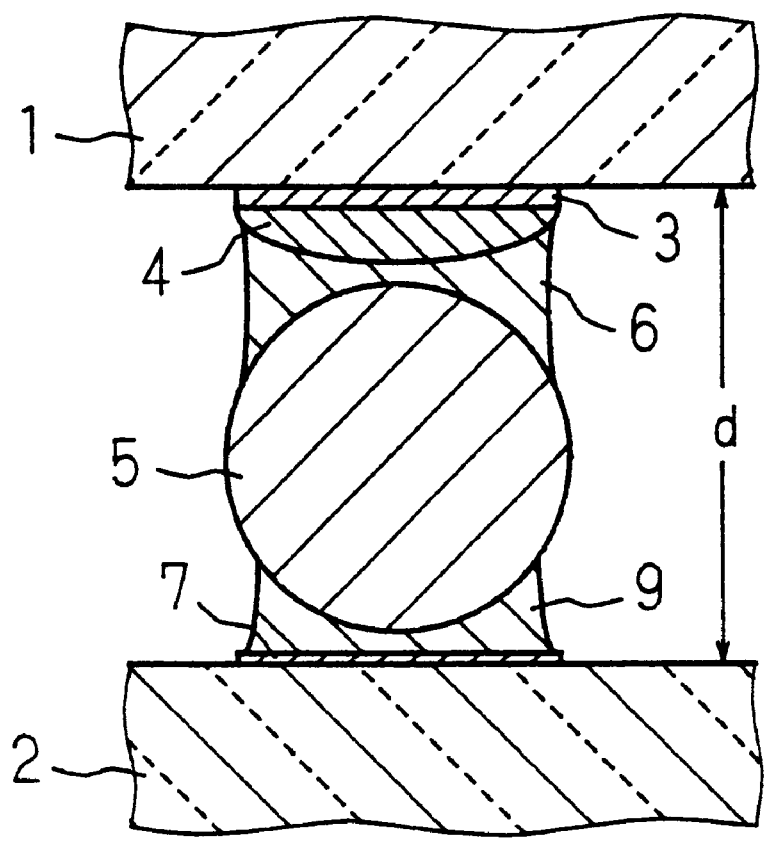
FIG. 3 is a schematic sectional view showing a main part of a semiconductor device of the present invention.

FIG. 3 is a schematic sectional view showing a main part of a semiconductor device wherein the semiconductor package shown in FIG. 2 is mounted on a printed circuit board. The connection between a metal pad 7 formed on a surface of the printed circuit board 2 and the metal ball 5 is performed through reflow soldering with an interconnecting solder 9 of 63 Sn/37 Pb (wt. %).

Detailed description of the case 1 in Table 1 will be given below.

The package body 1 is designed to comprise 361 pins as being an outer diameter of 25.4 mm ☐, a thickness of 2.5 mm, and a pin-pitch of 1.27 mm. On an Ni/Au plated W-pad (metal pad 3) of 0.6 mm in diameter is printed solder paste by using a metal mask of 0.7 mm in opening diameter and 0.2 mm in opening depth, and followed by reflow at a temperature of approximately 330° C. As a result of these treatments the metal bump 4 of approximately 150 μm height is obtained. Solder paste (6) of 63 Sn/37 Pb (wt. %) is applied onto the metal bump 4 by printing using a metal mask with an opening diameter of 0.7 mm and an opening depth of 0.2 mm. Afterwards the 90 Pb/10 Sn (wt. %) metal ball 5 of 750 μm diameter is placed thereon and reflow at a temperature of approximately 210° C. is carried out. By inverting the above assembly the semiconductor package shown in FIG. 2 is obtained in which the interconnecting terminal height h is observed as being approximately 950 μm.

Next 63 Sn/37 Pb (wt. %) solder paste (9) is printed on the metal pad 7 of 0.7 mm in diameter formed on the surface of the printed circuit board 2 by using a metal mask with an opening diameter of 0.7 mm and an opening depth of 0.2 mm. Finally the above-obtained printed circuit board 2 and the semiconductor package shown in FIG. 2 are positioned with each interconnecting terminal being corresponded and submitted to successive reflow treatment. The thus manufactured semiconductor device shown in FIG. 3 is such desired that the package body 1 and the printed circuit board 2 are connected face-to-face with each other by a space d of approximately 1 mm between two surfaces.

Ten more specimens made according to the same process were submitted to a fatigue resistance test in which 500 runs of the temperature cycle from −40 to 125° C. were repeated with the pace of 1 cycle per 1 hr. As the result no disconnection was detected for all these specimens.

Control

Figure 4:
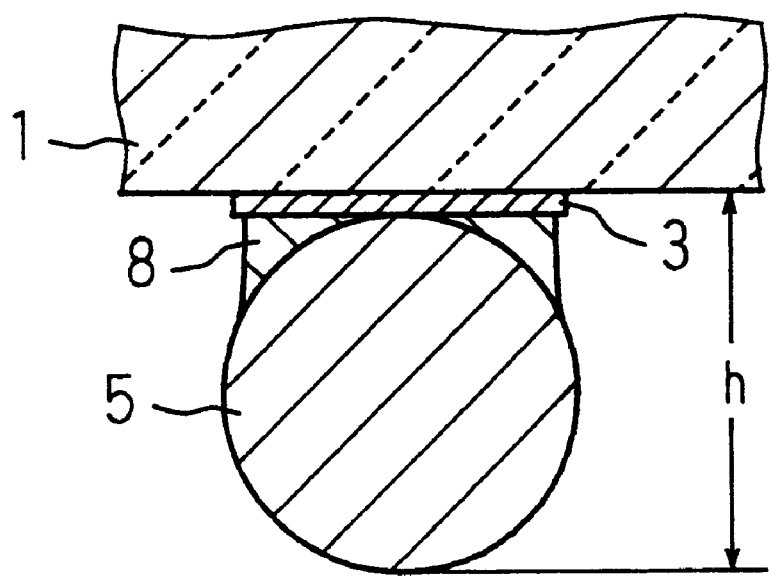
FIG. 4 is a schematic sectional view showing a main part of a semiconductor package of a control.

A semiconductor device with a different design manufactured for comparison was tested in a similar manner. In the control, by using the same package body as in the embodiment that comprises 361 pins and has an outer diameter of 25.4 mm ☐, a thickness of 2.5 mm and a pin-pitch of 1.27 mm, the semiconductor package is manufactured in the following method: First 63 Sn/37 Pb (wt. %) solder paste (8) is printed on an Ni/Au plated W-pad (metal pad 3) of 0.6 mm in diameter by using a metal mask of 0.7 mm in opening diameter and 0.2 mm in opening depth. In addition a 90 Pb/10 Sn (wt. %) metal ball 5 of 750 μm in diameter is placed thereon, and reflow at a temperature of approximately 210° C. is carried out. By inverting the above assembly the semiconductor package shown in FIG. 4 is obtained in which the interconnecting terminal height h is observed as being approximately 800 μm.

Figure 5:
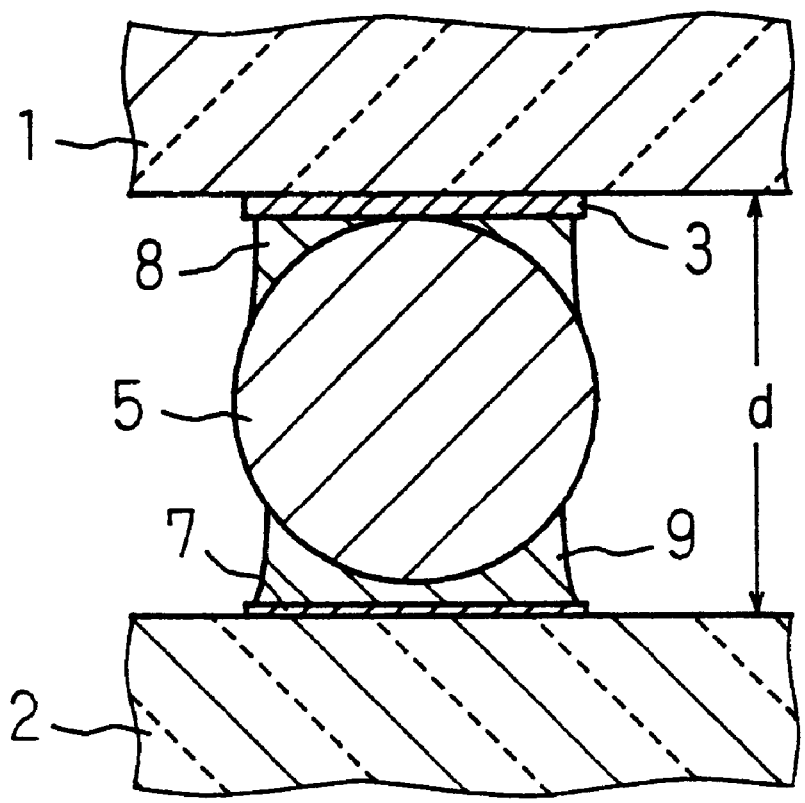
FIG. 5 is a schematic sectional view showing a main part of a semiconductor device of the control.

Next solder paste (9) of 63 Sn/37 Pb (wt. %) is printed on a metal pad 7 of 0.7 mm in diameter formed on a printed circuit board 2 by using a metal mask having an opening diameter of 0.7 mm and an opening depth of 0.2 mm. Finally the above-obtained printed circuit board 2 and the semiconductor package shown in FIG. 4 are positioned with each interconnecting terminal being corresponded and submitted to successive reflow treatment. The thus manufactured semiconductor device shown in FIG. 5 is such designed that the package body 1 and the printed circuit board 2 are connected face-to-face with each other by a space (d) of approximately 800 μm.

As a control, ten more specimens made according to the abovementioned process were submitted to a fatigue resistance test in which temperature cycles from −40 to 125° C. were repeated with a pace of 1 cycle per 1 hr. As the result, at 300 runs disconnection was detected in all these specimens.

As described above in the present invention the higher interconnecting terminal which is accomplished by providing a metal bump between a metal pad and an interconnecting solder has a favorable effect that a deformation caused by the difference of the coefficient of the thermal expansion between a semiconductor package and a substrate is decreased. This results in enhancing the fatigue resistance against temperature fluctuations as well as improving the reliability around the interconnecting portion.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor package to be mounted on a substrate through a metal ball and an interconnecting solder, comprising:
   a package body having a substantially planar surface;
   at least one metal pad formed on said planar surface; and
   a metal bump on a surface of said at least one metal pad, a top surface of said metal bump being elevated above said planar surface, said metal bump being made of a material different than said metal pad, and which is to be connected to a metal ball through an interconnecting solder, wherein the melting point of said metal bump is higher than that of the interconnecting solder.

2. A semiconductor package according to claim 1 wherein the melting points of said metal bump and said metal ball are higher than that of the interconnecting solder.

3. A semiconductor package according to claim 1, wherein
said metal bump consists of 90 Pb/10 Sn;
said interconnecting solder consists of 63 Sn/37 Pb; and
said metal ball consists of 90 Pb/10 Sn.

4. A semiconductor package according to claim 1, wherein
said metal bump consists of 90 Pb/10 Sn;
said interconnecting solder consists of 63 Sn/37 Pb; and
said metal ball consists of 95 Pb/5 Sn.

5. A semiconductor package according to claim 1, wherein
said metal bump consists of 95 Pb/5 Sn;
said interconnecting solder consists of 63 Sn/37 Pb; and
said metal ball consists of 90 Pb/10 Sn.

6. A semiconductor package according to claim 1, wherein
said metal bump consists of 95 Pb/5 Sn;
said interconnecting solder consists of 63 Sn/37 Pb; and
said metal ball consists of 95 Pb/5 Sn.

7. A semiconductor package according to claim 1, wherein
said metal bump consists of 96.5 Sn/3.5 Ag;
said interconnecting solder consists of 63 Sn/37 Pb; and
said metal ball consists of 96.5 Sn/3.5 Ag.

8. A semiconductor device comprising:
a semiconductor package;
a substrate;
a metal ball; and
an interconnecting solder, wherein said semiconductor package comprises:
a package body having a substantially planar surface;
at least one metal pad formed on said planar surface;
a metal bump formed on a surface of said at least one metal pad, a top surface of said metal bump being elevated above said planar surface, said metal bump being made of a material different than said metal pad;
whereby said metal ball is connected to said metal bump through said interconnecting solder, and
wherein the melting points of said metal bump and said metal ball are higher than that of the interconnecting solder.

9. A semiconductor package according to claim 8, wherein
said metal bump consists of 90 Pb/10 Sn;
said interconnecting solder consists of 63 Sn/37 Pb; and
said metal ball consists of 90 Pb/10 Sn.

10. A semiconductor package according to claim 8, wherein
said metal bump consists of 90 Pb/10 Sn;
said interconnecting solder consists of 63 Sn/37 Pb; and
said metal ball consists of 95 Pb/5 Sn.

11. A semiconductor package according to claim 3, wherein
said metal bump consists of 95 Pb/5 Sn;
said interconnecting solder consists of 63 Sn/37 Pb; and
said metal ball consists of 90 Pb/10 Sn.

12. A semiconductor package according to claim 3, wherein
said metal bump consists of 95 Pb/5 Sn;
said interconnecting solder consists of 63 Sn/37 Pb; and
said metal ball consists of 95 Pb/5 Sn.

13. A semiconductor package according to claim 3, wherein
said metal bump consists of 96.5 Sn/3.5 Ag;
said interconnecting solder consists of 63 Sn/37 Pb; and
said metal ball consists of 96.5 Sn/3.5 Ag.

14. A semiconductor package, comprising:
a package body having a substantially planar surface;
a metal pad, formed as an input/output terminal for internal wiring in said package body; and
a metal bump to be connected to a metal ball via interconnecting solder, said metal bump consisting of solder on a surface of the metal pad so as to leave a predetermined space between said metal pad and said metal ball,
wherein the melting point of said metal bump is higher than that of the interconnecting solder and wherein the composition of the interconnecting solder is different from the composition of the metal bump.

15. A semiconductor package comprising,
a package body of a substantially plate-like shape;
a metal pad formed as an input/output terminal for internal wiring in said package body;
a metal bump consisting of solder on a surface of the metal pad so as to leave a predetermined space between the package body and a substrate to be connected thereto;
an interconnecting solder formed on the surface of the metal bump; and
a metal ball connected to the metal pad via the metal bump and the interconnecting solder;
wherein the melting points of the metal bump and the metal ball is higher than that of the interconnecting solder and wherein the composition of the interconnecting solder is different from the composition of the metal bump.

16. A semiconductor device in which a semiconductor package is mounted on a substrate via a metal ball and an interconnecting solder, comprising:
a package body having a substantially planar surface;
a metal pad formed as an input/output terminal for internal wiring in said package body;
a metal bump consisting of solder on a surface of the metal pad so as to leave a predetermined space between the package body and the substrate; and
a metal ball connected to said metal bump via the interconnecting solder;
wherein the melting points of the metal bump and the metal ball are higher than that of the interconnecting solder and wherein the composition of the interconnecting solder is different from the metal bump.

17. A semiconductor package according to claim 16, wherein
said metal bump consists of 90 Pb/10 Sn;
said interconnecting solder consists of 63 Sn/37 Pb; and said metal ball consists of 90 Pb/10 Sn.

18. A semiconductor package according to claim 16, wherein said metal bump consists of 90 Pb/10 Sn;
said interconnecting solder consists of 63 Sn/37 Pb; and
said metal ball consists of 95 Pb/5 Sn.

19. A semiconductor package according to claim 16, wherein said metal bump consists of 95 Pb/5 Sn;
said interconnecting solder consists of 63 Sn/37 Pb; and
said metal ball consists of 90 Pb/10 Sn.

20. A semiconductor package according to claim 16, wherein said metal bump consists of 95 Pb/5 Sn;
said interconnecting solder consists of 63 Sn/37 Pb; and
said metal ball consists of 95 Pb/5 Sn.

21. A semiconductor package according to claim 16, wherein said metal bump consists of 96.5 Sn/3.5 Ag;
said interconnecting solder consists of 63 Sn/37 Pb; and
said metal ball consists of 96.5 Sn/3.5 Ag.

* * * * *